(12) United States Patent
Liu et al.

(10) Patent No.: US 12,156,448 B2
(45) Date of Patent: Nov. 26, 2024

(54) DISPLAY PANEL AND MANUFACTURING METHOD THEREOF, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Jianghua Liu, Beijing (CN); Lili Du, Beijing (CN); Meng Li, Beijing (CN); Benlian Wang, Beijing (CN); Mingfang Wang, Beijing (CN); Yue Long, Beijing (CN)

(73) Assignees: Beijing BOE Technology Development Co., Ltd., Beijing (CN); Chengdu BOE Optoelectronics Technology Co., Ltd., Sichuan (CN)

( * ) Notice: Subject to any disclaimer, the term of this patent is extended or adjusted under 35 U.S.C. 154(b) by 0 days.

(21) Appl. No.: 18/015,623

(22) PCT Filed: Jan. 26, 2022

(86) PCT No.: PCT/CN2022/074014
§ 371 (c)(1),
(2) Date: Jan. 11, 2023

(87) PCT Pub. No.: WO2023/141814
PCT Pub. Date: Aug. 3, 2023

(65) Prior Publication Data
US 2024/0130178 A1 Apr. 18, 2024

(51) Int. Cl.
*H10K 59/131* (2023.01)
*G09G 3/32* (2016.01)
*H10K 59/35* (2023.01)

(52) U.S. Cl.
CPC ............ *H10K 59/131* (2023.02); *G09G 3/32* (2013.01); *G09G 2300/0408* (2013.01);
(Continued)

(58) Field of Classification Search
CPC .............................. H10K 59/131; G09G 3/32
See application file for complete search history.

(56) References Cited

U.S. PATENT DOCUMENTS

| | | | |
|---|---|---|---|
| 11,616,117 B2 * | 3/2023 | Lee | H10K 59/65 257/40 |
| 11,723,255 B2 * | 8/2023 | Hong | H10K 59/352 345/156 |
| 11,863,853 B2 * | 1/2024 | Ye | H04M 1/0266 |

FOREIGN PATENT DOCUMENTS

| | | |
|---|---|---|
| CN | 111009195 A | 4/2020 |
| CN | 112086492 A | 12/2020 |

* cited by examiner

*Primary Examiner* — Sardis F Azongha
(74) *Attorney, Agent, or Firm* — WHDA, LLP

(57) ABSTRACT

A display panel, including: a base substrate including an Under Display Camera (UDC) area and a normal display area located around a periphery of the UDC area, and specifically, the normal display area includes a plurality of sub-pixel driving circuits, and the UDC area includes a plurality of groups of sub-pixels, each of the plurality of groups of sub-pixels including at least two sub-pixels of a same color which have their anodes coupled to each other; and a plurality of first transparent wires, anodes in each group of sub-pixels coupled to a corresponding sub-pixel driving circuit among the plurality of sub-pixel driving circuits through a corresponding first transparent wire among the plurality of first transparent wires.

19 Claims, 3 Drawing Sheets

(52) U.S. Cl.
CPC ............... *G09G 2300/0426* (2013.01); *G09G 2300/0452* (2013.01); *G09G 2300/0819* (2013.01); *G09G 2300/0842* (2013.01); *H10K 59/35* (2023.02)

DISPLAY PANEL AND MANUFACTURING METHOD THEREOF, AND DISPLAY DEVICE

CROSS-REFERENCE TO RELATED APPLICATIONS

This application is the U.S. national phase of PCT Application No. PCT/CN2022/074014 filed on Jan. 26, 2022, the disclosure of which is incorporated in its entirety by reference herein.

TECHNICAL FIELD

The present disclosure relates to a field of display technology, and especially to a display panel and a manufacturing method thereof, and a display device.

BACKGROUND

With consumers' constant pursuit of better effects of display products viewed from different angles, extremely narrow frames and even full screen displays are becoming new trends in the development of OLED (Organic Light-Emitting Diode) products. As screen-to-body ratios of many high-end cellphones increase gradually, full screens have become the current trend. The most critical problem with full screens is how to dispose front-facing cameras. In order to achieve a higher screen-to-body ratio, notch-shaped screens, waterdrop-shaped screens, and punch-hole screens appeared successively. Although those forms of full screens improve the screen-to-body ratio, it has a great influence on appearances of cellphones. Therefore, with comprehensive consideration, an Under Display Camera (UDC) is the best choice for the full screen.

A UDC refers to a front-facing camera that is below a screen but does not affect display function of the screen. The screen above the camera can still display images normally when a user is not using the front-facing camera. So, the UDC does not need any camera holes in appearance, achieving display effects of a full screen in fact.

However, in the related arts, a display PPI (Pixels Per Inch) of an under-display area is 400, which requires at least three additional layers of transparent ITO (Indium Tin Oxide) leads and three insulation layers than a normal display area, that is, six additional layers of mask including insulation layers are needed, which increases costs and demands for plant capacity.

SUMMARY

Embodiments of the present disclosure provide a display panel and a manufacturing method thereof, and a display device, capable of reducing the number of ITO leads and reducing the number of masks.

A first aspect of the present disclosure provides a display panel, including: a base substrate including a UDC area and a normal display area located around a periphery of the UDC area, and specifically, the normal display area includes a plurality of sub-pixel driving circuits, and the UDC area includes a plurality of groups of sub-pixels, each of the plurality of groups of sub-pixels including at least two sub-pixels of a same color which have their anodes coupled to each other; and a plurality of first transparent wires, anodes in each group of sub-pixels coupled to a corresponding sub-pixel driving circuit among the plurality of sub-pixel driving circuits through a corresponding first transparent wire among the plurality of first transparent wires.

Optionally, the UDC area further includes a plurality of second transparent wires, and the at least two sub-pixels of a same color have their anodes coupled to each other through a corresponding second transparent wire among the plurality of second transparent wires.

Optionally, the display panel further includes a planarization layer, the first transparent wires are located between the planarization layer and the base substrate, and the second transparent wires are located on a side of the planarization layer facing away from the base substrate.

Optionally, each of the plurality of groups of sub-pixels includes two red sub-pixels or two blue sub-pixels or four green sub-pixels.

Optionally, the display panel includes a plurality of rows of first pixel units and a plurality of rows of second pixel units arranged alternately; each of the first pixel units includes a first red sub-pixel, a first green sub-pixel, a first blue sub-pixel, and a second green sub-pixel sequentially arranged along a row direction; each of the second pixel units includes a second blue sub-pixel, a third green sub-pixel, a second red sub-pixel, and a fourth green sub-pixel sequentially arranged along the row direction.

Optionally, the two red sub-pixels included in each group of sub-pixels include a first red sub-pixel of a first pixel unit and a second red sub-pixel of a second pixel unit adjacent to the first pixel unit along a column direction; the two blue sub-pixels included in each group of sub-pixels include a first blue sub-pixel of a first pixel unit and a second blue sub-pixel of a second pixel unit adjacent to the first pixel unit along a column direction.

Optionally, the two red sub-pixels included in each group of sub-pixels include two first red sub-pixels of two neighboring first pixel units along a row direction or two second red sub-pixels of two neighboring second pixel units along a row direction; the two blue sub-pixels included in each group of sub-pixels include two first blue sub-pixels of two neighboring first pixel units along a row direction or two second blue sub-pixels of two neighboring second pixel units along a row direction.

Optionally, the four green sub-pixels included in each group of sub-pixels include a first green sub-pixel and a second green sub-pixel of a first pixel unit and a third green sub-pixel and a fourth green sub-pixel of a second pixel unit adjacent to the first pixel unit along a column direction.

Optionally, each of the anodes includes, in a direction away from the base substrate, a third transparent conductive layer, a metal layer, and a fourth transparent conductive layer sequentially laminated, and the third transparent conductive layer is multiplexed as the second transparent wires.

Optionally, there is a first pitch between two neighboring first transparent wires, and a sum of a characteristic width of the first transparent wires and the first pitch ranges from 2.7 μm to 3.0 μm.

Optionally, each group of sub-pixels corresponds to one sub-pixel driving circuit.

Optionally, the planarization layer includes a plurality of via holes through which anodes in each of the groups of sub-pixels are coupled to a corresponding first transparent wire among the plurality of first transparent wires.

A second aspect of the present disclosure provides a display device including the display panel described above.

A third aspect of the present disclosure provides a method for manufacturing a display panel, including: providing a base substrate including a UDC area and a normal display area located around a periphery of the UDC area; forming a plurality of sub-pixel driving circuits in the normal display area; forming a plurality of groups of sub-pixels in the UDC area, each of the plurality of groups of sub-pixels including at least two sub-pixels of a same color which have their anodes coupled to each other; and forming a plurality of first transparent wires, anodes in each group of sub-pixels coupled to a corresponding sub-pixel driving circuit among the plurality of sub-pixel driving circuits through a corresponding first transparent wire among the plurality of first transparent wires.

Optionally, the method described above further includes: forming a plurality of second transparent wires in the UDC area, and specifically, the at least two sub-pixels of a same color have their anodes coupled to each other through a corresponding second transparent wire among the plurality of second transparent wires.

Optionally, the forming the plurality of second transparent wires in the UDC area further includes: forming a planarization layer on the base substrate, the planarization layer including a plurality of via holes through which anodes in each of the groups of sub-pixels are coupled to a corresponding first transparent wire among the plurality of first transparent wires; forming a third transparent conductive layer on a side of the planarization layer away from the base substrate; applying a photoresist on the third transparent conductive layer, where the photoresist includes first portions, second portions, and third portions, a thickness of the first portions being greater than a thickness of the second portions, a thickness of the second portions being greater than a thickness of the third portions, and specifically, orthogonal projections of the first portions on the base substrate overlap with orthogonal projections of anodes in all groups of sub-pixels on the base substrate, orthogonal projections of the second portions on the base substrate overlap with orthogonal projections of the plurality of second transparent wires on the base substrate, and orthogonal projections of the third portions on the base substrate are located in the display area; and exposing and developing the photoresist, and forming the plurality of second transparent wires through the third transparent conductive layer corresponding to the second portions of the photoresist.

DETAILED DESCRIPTION

In order to make technical problems to be solved, technical solutions and advantages of the present disclosure more apparent, the present disclosure will be described hereinafter in a clear and complete manner in conjunction with drawings and embodiments.

In the related arts, a front-facing camera is typically provided under a display in order to achieve a full display. In a UDC area, only a light-emitting device portion, which includes an anode or anodes, typically remains. Meanwhile a driving circuit portion for light-emitting devices is provided in a normal display area, and the light-emitting device portion is connected to the driving circuit portion through ITO wires. If the UDC area has a high display PPI, such as 400 PPI, then there will be relatively more ITO wires. And in addition, ITO pitch is typically of 4 μm. To ensure connections between light-emitting devices and driving circuits, three layers of ITO are generally required, with corresponding planarization (PLN) layers, six layers are required in total. Therefore, with high cost and a large demand for production capacity, the related arts are not conducive to production, and the number of masks needs to be reduced.

An embodiment of the present disclosure provides a display panel, including: a base substrate including a UDC area and a normal display area located around a periphery of the UDC area, and specifically, the normal display area includes a plurality of sub-pixel driving circuits, and the UDC area includes a plurality of groups of sub-pixels, each of the plurality of groups of sub-pixels including at least two sub-pixels of a same color which have their anodes coupled to each other; and a plurality of first transparent wires, anodes in each group of sub-pixels coupled to a corresponding sub-pixel driving circuit among the plurality of sub-pixel driving circuits through a corresponding first transparent wire among the plurality of first transparent wires.

An embodiment of the present disclosure provides a display panel that makes anodes included in at least two sub-pixels of a same color coupled to each other, and couples anodes in each group of sub-pixels to a corresponding sub-pixel driving circuit among the plurality of sub-pixel driving circuits through a corresponding first transparent wire among the plurality of first transparent wires, reducing the number of transparent wires, thereby reducing the number of transparent conductive films, and meanwhile reducing the number of planarization layers corresponding to the transparent conductive films.

In some embodiments, each group of sub-pixels corresponds to one sub-pixel driving circuit.

The present disclosure enables one sub-pixel driving circuit to simultaneously drive two sub-pixels by means of each group of sub-pixels corresponding to one sub-pixel driving circuit.

Figure 1:
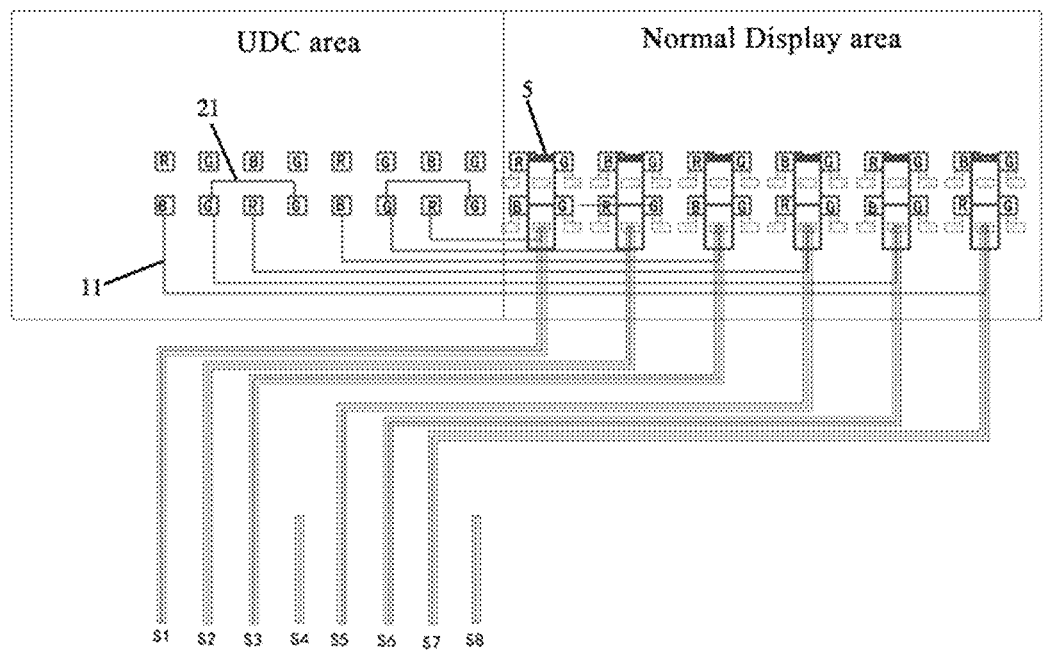
FIG. 1 is a diagram illustrating a sub-pixel driving circuit for driving at least two sub-pixels of a same color according to an embodiment of the present disclosure.

FIG. 1 is a diagram illustrating a sub-pixel driving circuit for driving at least two sub-pixels of a same color according to an embodiment of the present disclosure. As shown in FIG. 1, a display panel includes a UDC area and a normal display area located around a periphery of the UDC area, and the normal display area includes a plurality of sub-pixel driving circuits 5. The UDC area includes a plurality of groups of sub-pixels, each of the plurality of groups of sub-pixels including at least two sub-pixels of a same color which have their anodes coupled to each other; and the display panel further includes a plurality of first transparent wires 11, anodes in each group of sub-pixels coupled to a corresponding sub-pixel driving circuit 5 among the plurality of sub-pixel driving circuits 5 through a corresponding first transparent wire 11 among the plurality of first transparent wires 11.

In embodiments of the present disclosure, the UDC area is provided with anodes but without any driving circuit, so that more external light can be collected by a camera module, that is, components above the camera module are substantially transparent to the camera module, improving transmittance of the UDC area. Since driving circuits is provided in the normal display area, driving circuits and anodes are connected by transparent wires. Embodiments of the present disclosure enable one sub-pixel driving circuit to simultaneously drive two sub-pixels by making anodes included in at least two sub-pixels of a same color coupled to each other.

In some embodiments, the UDC area further includes a plurality of second transparent wires, and the at least two sub-pixels of a same color have their anodes coupled to each other through a corresponding second transparent wire among the plurality of second transparent wires.

Embodiments of the present disclosure enable one sub-pixel driving circuit to simultaneously drive two sub-pixels by coupling anodes included in two sub-pixels of a same color through one of the second transparent wires.

Figure 2:
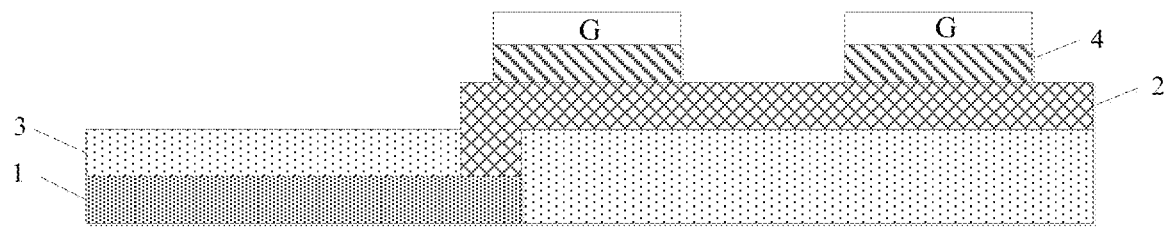
FIG. 2 is a cross-sectional view of a first method how anodes included in two green sub-pixels are overlapped and connected according to an embodiment of the present disclosure.

As shown in FIG. 1, anodes of two green sub-pixels are coupled by one of the second transparent wires 21. FIG. 2 is a cross-sectional view of a first method how anodes included in two green sub-pixels are overlapped and connected according to an embodiment of the present disclosure; as shown in FIG. 1, anodes 4 of two green sub-pixels are coupled by one of the second transparent wires provided in a second transparent conductive layer.

In some embodiments, there is a first pitch between two neighboring first transparent wires, and a sum of a characteristic width of the first transparent wires and the first pitch ranges from 2.7 µm to 3.0 µm.

The display panel according to embodiments of the present disclosure, by coupling anodes in each group of sub-pixels to a corresponding sub-pixel driving circuit 5 among the plurality of sub-pixel driving circuits 5 through a corresponding first transparent wire 11 among the plurality of first transparent wires 11, not only enables one sub-pixel driving circuit to drive two sub-pixels to reduce the number of first transparent wires but also reduces the sum of the characteristic width of the first transparent wires and the first pitch, that is, reduces the ITO pitch, and thus ITO layers occupied by the first transparent wires can be reduced.

In some embodiments, the display panel further includes a planarization layer, the first transparent wires are located between the planarization layer and the base substrate, and the second transparent wires are located on a side of the planarization layer facing away from the base substrate.

A display substrate according to embodiments of the present disclosure, with the planarization layer, is capable of planarizing anodes provided above the planarization layer so that light-emitting devices provided above the anodes are relatively planar during display, thereby reducing a color shift.

As shown in FIG. 2, the display panel further includes a planarization layer 3, the first transparent wires 11 are located between the planarization layer 3 and the base substrate, and the second transparent wires 21 are located on a side of the planarization layer 3 facing away from the base substrate.

A first transparent conductive layer 1 includes a plurality of first transparent wires 11, and a second transparent conductive layer 2 includes a plurality of second transparent wires 21.

In some embodiments, each of the anodes includes, in a direction away from the base substrate, a third transparent conductive layer, a metal layer, and a fourth transparent conductive layer sequentially laminated, and the third transparent conductive layer is multiplexed as the second transparent wires.

With one of the third transparent conductive layer and the fourth transparent conductive layer in each of the anodes multiplexed as the second transparent wires, embodiments of the present disclosure can further reduce the number of masks and simplify fabrication process due to reduction of masks.

Figure 3:
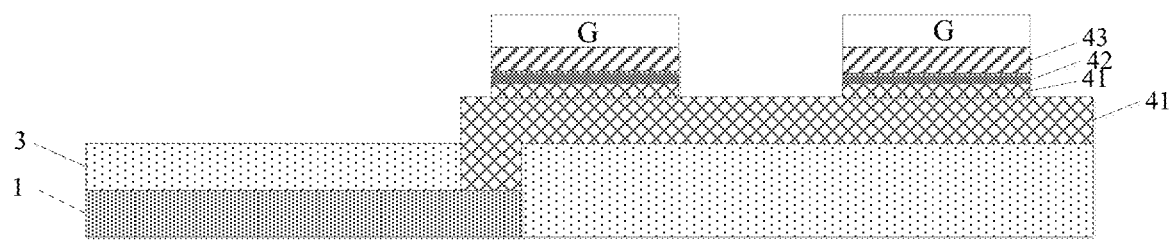
FIG. 3 is a cross-sectional view of a second method how anodes included in two green sub-pixels are overlapped and connected according to an embodiment of the present disclosure.

FIG. 3 is a cross-sectional view of a second method how anodes included in two green sub-pixels are overlapped and connected according to an embodiment of the present disclosure; in which, each of the anodes 4 includes, in a direction away from the base substrate, a third transparent conductive layer 41, a metal layer 42, and a fourth transparent conductive layer 43 sequentially laminated, and the third transparent conductive layer 41 is multiplexed as one of the second transparent wires 21.

In the display panel according to embodiments of the present disclosure, one of the third transparent conductive layer and the fourth transparent conductive layer in each of the anodes is multiplexed as second transparent conductive connection lines to connect two sub-pixels of a same color included by each group of sub-pixels. During fabrication of the third transparent conductive layer, connections between one of the second transparent wires and the two anodes are implemented by applying different doses of photoresists at different positions of the third transparent conductive layer to form photoresists of different thicknesses.

In some embodiments, the planarization layer includes a plurality of via holes through which anodes in each of the groups of sub-pixels are coupled to a corresponding first transparent wire among the plurality of first transparent wires.

Embodiments of the present disclosure implement coupling of the anodes to the first transparent wires by providing a plurality of via holes in the planarization layer.

Figure 5:
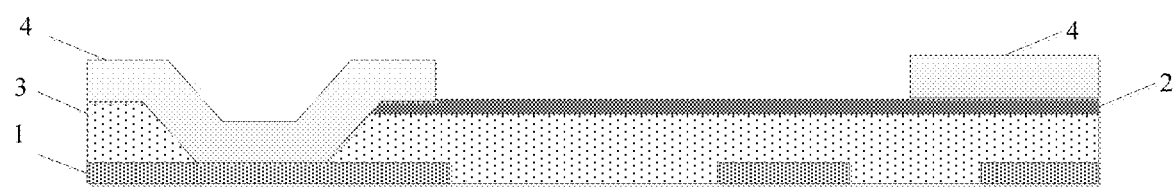
FIG. 5 is a cross-sectional view of a method how anodes included in two sub-pixels of a same color are overlapped and connected according to an embodiment of the present disclosure.

FIG. 5 is a cross-sectional view of a method how anodes included in two sub-pixels of a same color are overlapped and connected according to an embodiment of the present disclosure. As shown in FIG. 5, an anode of one of the sub-pixels is coupled to a corresponding sub-pixel driving circuit through a first transparent wire, and is coupled to an anode of the other sub-pixel in the same group of sub-pixels through one of the second transparent wires 21.

As shown in FIG. 5, in embodiments of the present disclosure, two sub-pixels of a same color have their anodes directly connected by one of the second transparent wires with no insulation layer therebetween.

In some embodiments, each of the plurality of groups of sub-pixels includes two red sub-pixels or two blue sub-pixels or four green sub-pixels.

With each group of sub-pixels including two red sub-pixels or two blue sub-pixels or four green sub-pixels, with anodes included in two red sub-pixels or two blue sub-pixels or four green sub-pixels coupled, and with anodes in each group of sub-pixels coupled to a corresponding sub-pixel driving circuit through a corresponding first transparent wire, the display panel according to embodiments of the present disclosure not only reduces the number of first transparent wires, thereby reducing the number of transparent conductive layers, but also reduces the number of planarization layers corresponding to transparent conductive layers.

As shown in FIG. 1, anodes 4 of two green sub-pixels are coupled by one of the second transparent wires provided in a second transparent conductive layer. In other examples, the at least two sub-pixels of a same color include not only two green sub-pixels, but also two red sub-pixels or two blue sub-pixels, or four green sub-pixels.

For example, anodes 4 of two red sub-pixels are coupled by one of the second transparent wires provided in a second transparent conductive layer. For example, anodes 4 of two blue sub-pixels are coupled by one of the second transparent wires provided in a second transparent conductive layer. For example, anodes 4 of four green sub-pixels are coupled by one of the second transparent wires 21 provided in a second transparent conductive layer 2.

In some embodiments, the display panel includes a plurality of rows of first pixel units and a plurality of rows of second pixel units arranged alternately. Each of the first pixel units includes a first red sub-pixel, a first green sub-pixel, a first blue sub-pixel, and a second green sub-pixel sequentially arranged along a row direction. Each of the second pixel units includes a second blue sub-pixel, a third green sub-pixel, a second red sub-pixel, and a fourth green sub-pixel sequentially arranged along the row direction.

Figure 6:
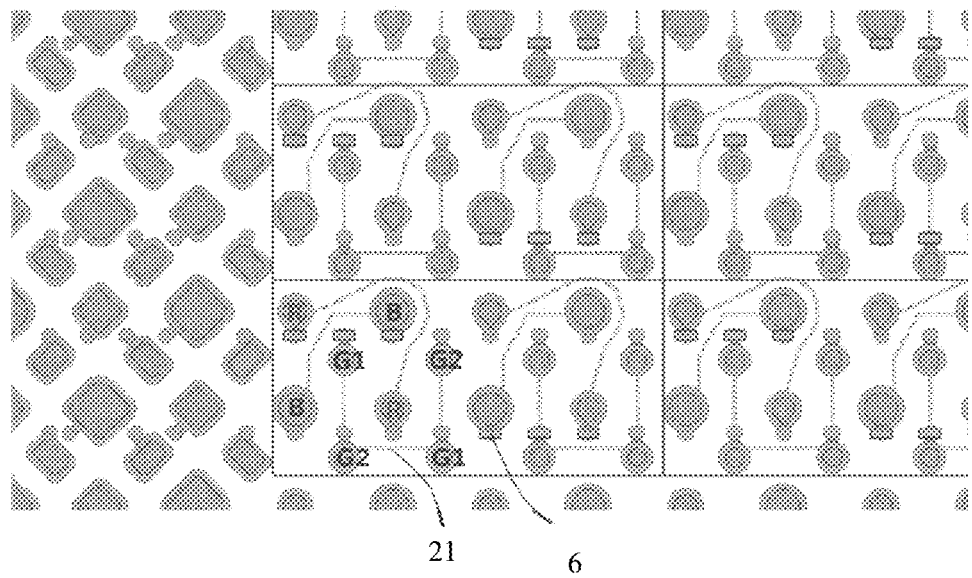
FIG. 6 is a diagram illustrating a first arrangement of connections between sub-pixels of same colors according to an embodiment of the present disclosure.
Figure 7:
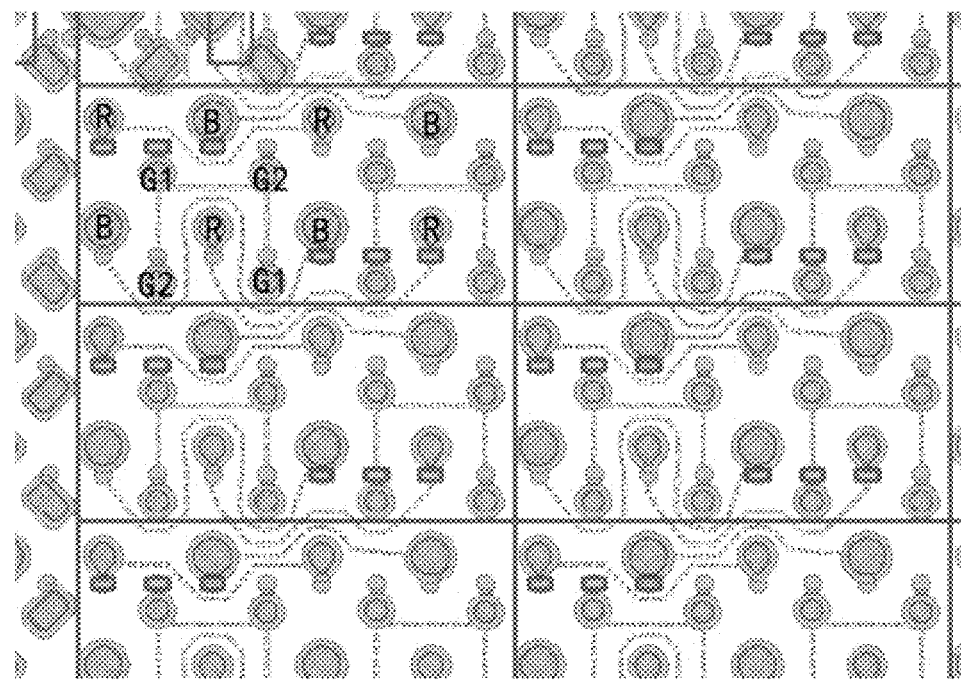
FIG. 7 is a diagram illustrating a second arrangement of connections between sub-pixels of same colors according to an embodiment of the present disclosure.

As shown in FIGS. 6 and 7, the display panel according to embodiments of the present disclosure includes a plurality of sub-pixels arranged in a pixel arrangement of RGBG (red, green, blue, green). Each of the first pixel units has sub-pixels of R, G, B, and G sequentially; each of the second pixel units has sub-pixels of B, G, R, and G sequentially. The pixel arrangement of RGBG can improve resolution of the display panel and therefore display quality.

In some embodiments, the two red sub-pixels included in each group of sub-pixels include a first red sub-pixel of a first pixel unit and a second red sub-pixel of a second pixel unit adjacent to the first pixel unit along a column direction; the two blue sub-pixels included in each group of sub-pixels include a first blue sub-pixel of a first pixel unit and a second blue sub-pixel of a second pixel unit adjacent to the first pixel unit along the column direction.

As shown in FIG. 6, each group of sub-pixels includes two red sub-pixels, one of which belongs to one of the first pixel units and the other of which belongs to one of the second pixel units adjacent to the one of the first pixel units in the column direction. Each group of sub-pixels includes two blue sub-pixels, one of which belongs to one of the first pixel units and the other of which belongs to one of the second pixel units adjacent to the one of the first pixel units in the column direction.

In some embodiments, the two red sub-pixels included in each group of sub-pixels include two first red sub-pixels of two neighboring first pixel units along a row direction or two second red sub-pixels of two neighboring second pixel units along a row direction; the two blue sub-pixels included in each group of sub-pixels include two first blue sub-pixels of two neighboring first pixel units along a row direction or two second blue sub-pixels of two neighboring second pixel units along a row direction.

As shown in FIG. 7, each group of sub-pixels includes two red sub-pixels, one of which belongs to one of the first pixel units and the other of which belongs to another one of the first pixel units adjacent to the former one in the row direction. Each group of sub-pixels includes two blue sub-pixels, one of which belongs to one of the first pixel units and the other of which belongs to another one of the first pixel units adjacent to the former one in the row direction.

In some embodiments, the four green sub-pixels included in each group of sub-pixels include a first green sub-pixel and a second green sub-pixel of a first pixel unit and a third green sub-pixel and a fourth green sub-pixel of a second pixel unit adjacent to the first pixel unit along the column direction.

As shown in FIGS. 6 and 7, each group of sub-pixels includes four green sub-pixels, two of which belong to one of the first pixel units and the other two of which belong to one of the second pixel units adjacent to the one of the first pixel units in the column direction.

As described above, anodes of two red sub-pixels are coupled by a transparent wire, anodes of two green sub-pixels are coupled by a transparent wire, and anodes of four green sub-pixels are coupled by a transparent wire.

Figure 8:
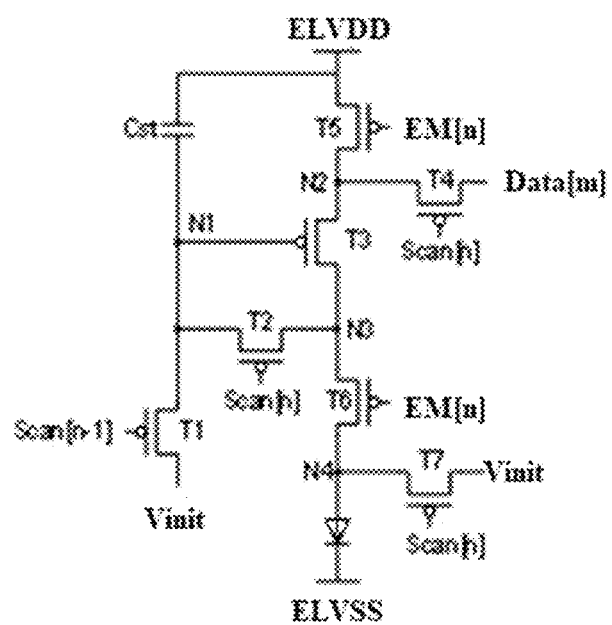
FIG. 8 is a diagram illustrating a sub-pixel driving circuit according to an embodiment of the present disclosure.

As shown in FIG. 8, the sub-pixel driving circuit includes a first storage capacitor Cst, a first transistor T1, a second transistor T2, a third transistor T3, a fourth transistor T4, a fifth transistor T5, a sixth transistor T6 and a seventh transistor T7.

Specifically, one end of the first storage capacitor Cst is connected to a power line ELVDD, and the other end is connected to a first node N1; a control electrode of the first transistor T1 is connected to a first gate control signal line or a third gate control signal line, a first electrode of the first transistor T1 is connected to the first node N1, and a second electrode of the first transistor T1 is connected to an initialization voltage level signal line Vinit; a control electrode of the second transistor T2 is connected to a second gate control signal line or a fourth gate control signal line, a first electrode of the second transistor T2 is connected to the first node N1, and a second electrode of the second transistor T2 is connected to a third node N3; a control electrode of the third transistor T3 is connected to the first node N1, a first electrode of the third transistor T3 is connected to the second node N2, and a second electrode of the third transistor T3 is connected to the third node N3; a control electrode of the fourth transistor T4 is connected to the second or fourth gate control signal line, a first electrode of the fourth transistor T4 is connected to the second node N2, and a second electrode of the fourth transistor T4 is connected to a data line Data; a control electrode of the fifth transistor T5 is connected to a first light-emitting control signal line EM, a first electrode of the fifth transistor T5 is connected to the second node N2, and a second electrode of the fifth transistor T5 is connected to the power line ELVDD; a control electrode of the sixth transistor T6 is connected to the first light-emitting control signal line EM, a first electrode of the sixth transistor T6 is connected to a fourth node N4, and a second electrode of the sixth transistor T6 is connected to the third node N3; a control electrode of the seventh transistor T7 is connected to the second or fourth gate control signal line, a first electrode of the seventh transistor T7 is connected to the fourth node N4, and a second electrode of the seventh transistor T7 is connected to the initialization voltage level signal line Vinit.

In particular, the first electrode of the sixth transistor T6 is connected to the fourth node N4 and to an anode of a light-emitting device.

Scan lines S1 to S8 shown in FIG. 1 are used for providing scan signals to the sub-pixel driving circuit shown in FIG. 8, respectively.

Embodiments of the present disclosure further provide a display device including the display panel described above.

As shown in FIG. 1, a display panel includes a UDC area and a normal display area located around a periphery of the UDC area, and the normal display area includes a plurality of sub-pixel driving circuits 5. The UDC area includes a plurality of groups of sub-pixels, each of the plurality of groups of sub-pixels including at least two sub-pixels of a same color which have their anodes coupled to each other; and the display panel further includes a plurality of first transparent wires 11, anodes in each group of sub-pixels coupled to a corresponding sub-pixel driving circuit 5 among the plurality of sub-pixel driving circuits 5 through a corresponding first transparent wire 11 among the plurality of first transparent wires 11.

As shown in FIG. 1, anodes of two green sub-pixels are coupled by one of the second transparent wires 21. FIG. 2 is a cross-sectional view of a first method how anodes included in two green sub-pixels are overlapped and connected according to an embodiment of the present disclosure. As shown in FIG. 1, anodes 4 of two green sub-pixels are coupled by one of the second transparent wires provided in a second transparent conductive layer.

As shown in FIG. 2, the display panel further includes a planarization layer 3, the first transparent wires 11 are located between the planarization layer 3 and the base substrate, and the second transparent wires 21 are located on a side of the planarization layer 3 facing away from the base substrate.

FIG. 3 is a cross-sectional view of a second method how anodes included in two green sub-pixels are overlapped and connected according to an embodiment of the present disclosure; in which, each of the anodes 4 includes, in a direction away from the base substrate, a third transparent conductive layer 41, a metal layer 42, and a fourth transparent conductive layer 43 sequentially laminated, and the third transparent conductive layer 41 is multiplexed as one of the second transparent wires 21.

FIG. 5 is a cross-sectional view of a method how anodes included in two sub-pixels of a same color are overlapped and connected according to an embodiment of the present disclosure; as shown in FIG. 5, an anode of one of the sub-pixels is coupled to a corresponding sub-pixel driving circuit through a first transparent wire, and is coupled to an anode of the other sub-pixel in the same group of sub-pixels as the one through one of the second transparent wires 21.

As shown in FIG. 5, in embodiments of the present disclosure, two sub-pixels of a same color have their anodes directly connected by one of the second transparent wires with no insulation layer therebetween.

As shown in FIG. 1, anodes 4 of two green sub-pixels are coupled by one of the second transparent wires provided in a second transparent conductive layer. In other examples, the at least two sub-pixels of a same color include not only two green sub-pixels, but also two red sub-pixels or two blue sub-pixels, or four green sub-pixels.

For example, anodes 4 of two red sub-pixels are coupled by one of the second transparent wires provided in a second transparent conductive layer. For example, anodes 4 of two blue sub-pixels are coupled by one of the second transparent wires provided in a second transparent conductive layer. For example, anodes 4 of four green sub-pixels are coupled by one of the second transparent wires 21 provided in a second transparent conductive layer 2.

As shown in FIGS. 6 and 7, the display panel according to embodiments of the present disclosure includes a plurality of sub-pixels arranged in a pixel arrangement of RGBG (red, green, blue, green). Each of the first pixel units has sub-pixels of R, G, B, and G sequentially; each of the second pixel units has sub-pixels of B, G, R, and G sequentially. The pixel arrangement of RGBG can improve resolution of the display panel and therefore display quality.

As shown in FIG. 6, each group of sub-pixels includes two red sub-pixels, one of which belongs to one of the first pixel units and the other of which belongs to one of the second pixel units adjacent to the one of the first pixel units in the column direction. Each group of sub-pixels includes two blue sub-pixels, one of which belongs to one of the first pixel units and the other of which belongs to one of the second pixel units adjacent to the one of the first pixel units in the column direction.

As shown in FIG. 7, each group of sub-pixels includes two red sub-pixels, one of which belongs to one of the first pixel units and the other of which belongs to another one of the first pixel units adjacent to the former one in the row direction. Each group of sub-pixels includes two blue sub-pixels, one of which belongs to one of the first pixel units and the other of which belongs to another one of the first pixel units adjacent to the former one in the row direction.

As shown in FIGS. 6 and 7, each group of sub-pixels includes four green sub-pixels, two of which belong to one of the first pixel units and the other two of which belong to one of the second pixel units adjacent to the one of the first pixel units in the column direction.

As described above, anodes of two red sub-pixels are coupled by a transparent wire, anodes of two green sub-pixels are coupled by a transparent wire, and anodes of four green sub-pixels are coupled by a transparent wire.

The display device includes, but is not limited to, a radio frequency unit, a network module, an audio output unit, an input unit, a sensor, a display unit, a user input unit, an interface unit, a memory, a processor, and a power source. A person skilled in the art will appreciate that the structure of the display device described above shall not be construed as limiting the display device, while the display device may include more or fewer components described above, or a combination thereof, or a different arrangement of components. In embodiments of the present disclosure, the display device includes, but is not limited to, a display, a cell phone, a tablet PC, a television, a wearable electronic device, a navigation display device, and the like.

The display device may be any product or component having a display function such as a television, a display, a digital picture frame, a cell phone, a tablet PC and the like, and specifically, the display device further includes a flexible circuit board, a printed circuit board, and a backplane.

Embodiments of the present disclosure further provide a method for manufacturing a display panel, including: providing a base substrate including a UDC area and a normal display area located around a periphery of the UDC area; forming a plurality of sub-pixel driving circuits in the normal display area; forming a plurality of groups of sub-pixels in the UDC area, each of the plurality of groups of sub-pixels including at least two sub-pixels of a same color which have their anodes coupled to each other; and forming a plurality of first transparent wires, anodes in each group of sub-pixels coupled to a corresponding sub-pixel driving circuit among the plurality of sub-pixel driving circuits through a corresponding first transparent wire among the plurality of first transparent wires.

In some embodiments, the method described above further includes: forming a plurality of second transparent wires in the UDC area, and specifically, the at least two sub-pixels of a same color have their anodes coupled to each other through a corresponding second transparent wire among the plurality of second transparent wires.

Figure 4:
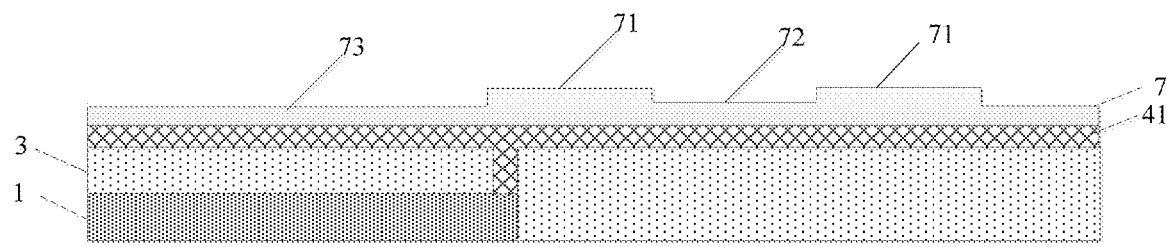
FIG. 4 is a diagram illustrating a manufacturing process of a second transparent wire according to an embodiment of the present disclosure.

FIG. 4 is a diagram illustrating a manufacturing process of a second transparent wire according to an embodiment of the present disclosure.

In some embodiments, the forming the plurality of second transparent wires in the UDC area further includes: forming a planarization layer 2 on the base substrate, the planarization layer including a plurality of via holes 6 through which anodes in each of the groups of sub-pixels are coupled to a corresponding first transparent wire 11 among the plurality of first transparent wires 11; forming a third transparent conductive layer 41 on a side of the planarization layer 3 away from the base substrate; applying a photoresist 7 on the third transparent conductive layer 41, where the photoresist 7 includes first portions 71, second portions 72, and third portions 73, a thickness of the first portions 71 being greater than a thickness of the second portions 72, a thickness of the second portions 72 being greater than a thickness of the third portions 73, and specifically, orthogonal projections of the first portions 71 on the base substrate overlap with orthogonal projections of anodes in all groups of sub-pixels on the base substrate, orthogonal projections of the second portions 72 on the base substrate overlap with orthogonal projections of the plurality of second transparent wires 21 on the base substrate, and orthogonal projections of the third portions 73 on the base substrate are located in the display area; and exposing and developing the photoresist, and forming the plurality of second transparent wires 21 through the third transparent conductive layer corresponding to the second portions of the photoresist.

In method embodiments of the present disclosure, orders of steps are not limited to serial numbers thereof. For a person skilled in the art, any change in orders of steps shall also fall within the scope of the present disclosure if without any creative effort.

It should be further appreciated that, the above embodiments have been described in a progressive manner, and same or similar contents in the embodiments may be referred to each other, and each embodiment has merely focused on differences from the others. Especially, embodiments are substantially similar to product embodiments, and thus have been described in a simple manner, referring to parts of descriptions of product embodiments for details.

Unless otherwise defined, any technical or scientific term used herein shall have common meaning understood by a person of ordinary skills. Such words as "first" and "second" involved in the present disclosure are merely used to differentiate components rather than to represent any order, quantity, or importance. Such terms as "include" or "comprise" or any similar word involved intend to means that an element or item before these terms contains elements or items listed thereafter and equivalents thereof, without excluding other components or objects. "Connect", "couple," or the like is not limited to physical or mechanical connections, but may comprise electrical connections, whether direct or indirect. "Up", "lower", "left", and "right" are used merely to indicate relative positional relationships, which may change accordingly when an absolute position of a described object changes.

It should be appreciated that, in the case that such an element as a layer, a film, a region or a substrate is arranged "on" or "under" another element, it may be directly arranged "on" or "under" the another element, or an intermediate element may be arranged therebetween.

In the description of above embodiments, particular features, structures, materials, or characteristics may be combined in any embodiment or embodiments in an appropriate manner.

The above embodiments are merely for illustrative purposes, but shall not be construed as limiting the scope of the present disclosure. Any person skilled in the art may make modifications or substitutions without departing from the spirit of the present disclosure, and these modifications and substitutions shall also fall within the scope of the present disclosure. Hence, the scope of the present disclosure shall be subject to the scope defined by the appended claims.

REFERENCE NUMERALS

1 First transparent conductive layer
11 First transparent wire
2 Second transparent conductive layer
21 Second transparent wire
3 Planarization layer
4 Anode
41 Third transparent conductive layer
42 Metal layer
43 Fourth transparent conductive layer
5 Sub-pixel driving circuit
6 Via holes
7 Photoresist
71 First portion
72 Second portion
73 Third portion

What is claimed is:

1. A display panel, comprising:
a base substrate comprising an Under Display Camera (UDC) area and a normal display area located around a periphery of the UDC area, wherein the normal display area comprises a plurality of sub-pixel driving circuits, and the UDC area comprises a plurality of groups of sub-pixels, each of the plurality of groups of sub-pixels comprising at least two sub-pixels of a same color which have their anodes coupled to each other; and
a plurality of first transparent wires, wherein anodes in each group of sub-pixels are coupled to a corresponding sub-pixel driving circuit among the plurality of sub-pixel driving circuits through a corresponding first transparent wire among the plurality of first transparent wires;
wherein there is a first pitch between two neighboring first transparent wires, and a sum of a characteristic width of the first transparent wires and the first pitch ranges from 2.7 μm to 3.0 μm.

2. The display panel according to claim 1, wherein the UDC area further comprises a plurality of second transparent wires, and the at least two sub-pixels of a same color have their anodes coupled to each other through a corresponding second transparent wire among the plurality of second transparent wires.

3. The display panel according to claim 2, wherein the display panel further comprises a planarization layer, the first transparent wires are located between the planarization layer and the base substrate, and the second transparent wires are located on a side of the planarization layer facing away from the base substrate.

4. The display panel according to claim 3, wherein the planarization layer comprises a plurality of via holes through which anodes in each of the groups of sub-pixels are coupled to a corresponding first transparent wire among the plurality of first transparent wires.

5. The display panel according to claim 2, wherein each of the anodes comprises, in a direction away from the base substrate, a third transparent conductive layer, a metal layer, and a fourth transparent conductive layer sequentially laminated, and the third transparent conductive layer is multiplexed as the second transparent wires.

6. The display panel according to claim 1, wherein each of the plurality of groups of sub-pixels comprises two red sub-pixels or two blue sub-pixels or four green sub-pixels.

7. The display panel according to claim 6, wherein the display panel comprises a plurality of rows of first pixel units and a plurality of rows of second pixel units arranged alternately;
each of the first pixel units comprises a first red sub-pixel, a first green sub-pixel, a first blue sub-pixel, and a second green sub-pixel sequentially arranged along a row direction;
each of the second pixel units comprises a second blue sub-pixel, a third green sub-pixel, a second red sub-pixel, and a fourth green sub-pixel sequentially arranged along the row direction.

8. The display panel according to claim 7, wherein the two red sub-pixels comprised in each group of sub-pixels comprise a first red sub-pixel of a first pixel unit and a second red sub-pixel of a second pixel unit adjacent to the first pixel unit along a column direction;
the two blue sub-pixels comprised in each group of sub-pixels comprise a first blue sub-pixel of a first pixel unit and a second blue sub-pixel of a second pixel unit adjacent to the first pixel unit along a column direction, or
the two red sub-pixels comprised in each group of sub-pixels comprise two first red sub-pixels of two neighboring first pixel units along a row direction or two second red sub-pixels of two neighboring second pixel units along a row direction;
the two blue sub-pixels comprised in each group of sub-pixels comprise two first blue sub-pixels of two neighboring first pixel units along a row direction or two second blue sub-pixels of two neighboring second pixel units along a row direction.

9. The display panel according to claim 7, wherein the four green sub-pixels comprised in each group of sub-pixels comprise a first green sub-pixel and a second green sub-pixel of a first pixel unit and a third green sub-pixel and a fourth green sub-pixel of a second pixel unit adjacent to the first pixel unit along a column direction.

10. The display panel according to claim 1, wherein each group of sub-pixels corresponds to one sub-pixel driving circuit.

11. A display device comprising a display panel,
the display panel comprising:
a base substrate comprising an Under Display Camera (UDC) area and a normal display area located around a periphery of the UDC area, wherein the normal display area comprises a plurality of sub-pixel driving circuits, and the UDC area comprises a plurality of groups of sub-pixels, each of the plurality of groups of sub-pixels comprising at least two sub-pixels of a same color which have their anodes coupled to each other; and
a plurality of first transparent wires, wherein anodes in each group of sub-pixels are coupled to a corresponding sub-pixel driving circuit among the plurality of sub-pixel driving circuits through a corresponding first transparent wire among the plurality of first transparent wires;

wherein there is a first pitch between two neighboring first transparent wires, and a sum of a characteristic width of the first transparent wires and the first pitch ranges from 2.7 μm to 3.0 μm.

12. The display device according to claim 11, wherein the UDC area further comprises a plurality of second transparent wires, and the at least two sub-pixels of a same color have their anodes coupled to each other through a corresponding second transparent wire among the plurality of second transparent wires.

13. The display device according to claim 12, wherein the display panel further comprises a planarization layer, the first transparent wires are located between the planarization layer and the base substrate, and the second transparent wires are located on a side of the planarization layer facing away from the base substrate.

14. The display device according to claim 11, wherein each of the plurality of groups of sub-pixels comprises two red sub-pixels or two blue sub-pixels or four green sub-pixels.

15. The display device according to claim 14, wherein the display panel comprises a plurality of rows of first pixel units and a plurality of rows of second pixel units arranged alternately;
each of the first pixel units comprises a first red sub-pixel, a first green sub-pixel, a first blue sub-pixel, and a second green sub-pixel sequentially arranged along a row direction;
each of the second pixel units comprises a second blue sub-pixel, a third green sub-pixel, a second red sub-pixel, and a fourth green sub-pixel sequentially arranged along the row direction.

16. The display device according to claim 15, wherein the two red sub-pixels comprised in each group of sub-pixels comprise a first red sub-pixel of a first pixel unit and a second red sub-pixel of a second pixel unit adjacent to the first pixel unit along a column direction;
the two blue sub-pixels comprised in each group of sub-pixels comprise a first blue sub-pixel of a first pixel unit and a second blue sub-pixel of a second pixel unit adjacent to the first pixel unit along a column direction, or
the two red sub-pixels comprised in each group of sub-pixels comprise two first red sub-pixels of two neighboring first pixel units along a row direction or two second red sub-pixels of two neighboring second pixel units along a row direction;
the two blue sub-pixels comprised in each group of sub-pixels comprise two first blue sub-pixels of two neighboring first pixel units along a row direction or two second blue sub-pixels of two neighboring second pixel units along a row direction.

17. A method for manufacturing a display panel, comprising:
providing a base substrate comprising an Under Display Camera (UDC) area and a normal display area located around a periphery of the UDC area;
forming a plurality of sub-pixel driving circuits in the normal display area;
forming a plurality of groups of sub-pixels in the UDC area, each of the plurality of groups of sub-pixels comprising at least two sub-pixels of a same color which have their anodes coupled to each other; and
forming a plurality of first transparent wires, wherein anodes in each group of sub-pixels are coupled to a corresponding sub-pixel driving circuit among the plurality of sub-pixel driving circuits through a corresponding first transparent wire among the plurality of first transparent wires;

wherein there is a first pitch between two neighboring first transparent wires, and a sum of a characteristic width of the first transparent wires and the first pitch ranges from 2.7 μm to 3.0 μm.

18. The method according to claim 17, further comprising:

forming a plurality of second transparent wires in the UDC area, wherein the at least two sub-pixels of a same color have their anodes coupled to each other through a corresponding second transparent wire among the plurality of second transparent wires.

19. The method according to claim 18, wherein the forming the plurality of second transparent wires in the UDC area further comprises:

forming a planarization layer on the base substrate, the planarization layer comprising a plurality of via holes through which anodes in each of the groups of sub-pixels are coupled to a corresponding first transparent wire among the plurality of first transparent wires;

forming a third transparent conductive layer on a side of the planarization layer away from the base substrate;

applying a photoresist on the third transparent conductive layer, wherein the photoresist comprises first portions, second portions, and third portions, a thickness of the first portions being greater than a thickness of the second portions, a thickness of the second portions being greater than a thickness of the third portions, wherein orthogonal projections of the first portions on the base substrate overlap with orthogonal projections of anodes in all groups of sub-pixels on the base substrate, orthogonal projections of the second portions on the base substrate overlap with orthogonal projections of the plurality of second transparent wires on the base substrate, and orthogonal projections of the third portions on the base substrate are located in the display area; and exposing and developing the photoresist, and forming the plurality of second transparent wires through the third transparent conductive layer corresponding to the second portions of the photoresist.

* * * * *